(12) United States Patent
Dhindsa et al.

(10) Patent No.: US 8,563,619 B2
(45) Date of Patent: Oct. 22, 2013

(54) METHODS AND ARRANGEMENTS FOR PLASMA PROCESSING SYSTEM WITH TUNABLE CAPACITANCE

(75) Inventors: Rajinder Dhindsa, San Jose, CA (US); Alexei Marakhtanov, Albany, CA (US)

(73) Assignee: Lam Research Corporation, Fremont, CA (US)

( * ) Notice: Subject to any disclaimer, the term of this patent is extended or adjusted under 35 U.S.C. 154(b) by 1512 days.

(21) Appl. No.: 11/770,664

(22) Filed: Jun. 28, 2007

(65) Prior Publication Data
US 2009/0223810 A1  Sep. 10, 2009

(51) Int. Cl.
*G01L 21/30* (2006.01)
*B44C 1/22* (2006.01)

(52) U.S. Cl.
USPC ............ 516/59; 216/58; 216/67; 219/121.43; 204/164

(58) Field of Classification Search
USPC ............ 216/58, 59, 67; 219/121.43; 204/164
See application file for complete search history.

(56) References Cited

U.S. PATENT DOCUMENTS

| | | | |
|---|---|---|---|
| 6,896,765 B2 * | 5/2005 | Steger | 156/345.51 |
| 2004/0027781 A1 * | 2/2004 | Hanawa et al. | 361/234 |
| 2005/0178505 A1 | 8/2005 | Kim | |
| 2005/0241769 A1 | 11/2005 | Satoyoshi et al. | |

FOREIGN PATENT DOCUMENTS

| | | |
|---|---|---|
| CN | 1682344 | 10/2005 |
| JP | 2005-539397 | 12/2005 |
| WO | WO-2004/027816 A2 | 4/2004 |
| WO | WO-2004/059716 A1 | 7/2004 |

OTHER PUBLICATIONS

"International Preliminary Report on Patentability", issued in PCT Application No. PCT/US2008/067881; Mailing Date: Jan. 14, 2010.
"International Search Report", Issued in PCT Application No. PCT/US2008/067881; Mailing Date: Dec. 29, 2008.
"Written Opinion". Issued in PCT Application No. PCT/US2008/067881; Mailing Date: Dec. 29, 2008.
"Search Report & Written Opinion", issued in Singapore Application No. 200908357-7: Mailing Date: Dec. 22, 2010.
"Notification of Reasons of Refusal", JP Application No. 2010-515015, Mailing Date: Sep. 18, 2012.
"Search and Examination Report", Issued in Singapore Application No. 200908357-7; Mailing Date: Aug. 25, 2011.

* cited by examiner

*Primary Examiner* — Shamim Ahmed
(74) *Attorney, Agent, or Firm* — IPSG, P.C. Intellectual Property Law

(57) ABSTRACT

A method for processing a substrate in a plasma processing chamber is provided. The substrate is disposed above a chuck and surrounded by an edge ring. The edge ring is electrically isolated from the chuck. The method includes providing RF power to the chuck. The method also includes providing a tunable capacitance arrangement. The tunable capacitance arrangement is coupled to the edge ring to provide RF coupling to the edge ring, resulting in the edge ring having an edge ring potential. The method further includes generating a plasma within the plasma processing chamber to process the substrate. The substrate is processed while the tunable capacitance arrangement is configured to cause the edge ring potential to be dynamically tunable to a DC potential of the substrate while processing the substrate.

20 Claims, 6 Drawing Sheets

METHODS AND ARRANGEMENTS FOR PLASMA PROCESSING SYSTEM WITH TUNABLE CAPACITANCE

BACKGROUND OF THE INVENTION

Growth in the semiconductor industry has been driven by advances in plasma processing. Due to the highly competitive nature of die semiconductor industry, device manufacturers may want to maximize yield and efficiently utilize the real estate available on a substrate. During plasma processing of the substrate, a plurality of parameters may need to be controlled to ensure high yield of devices being processed. A common cause of defective devices is the lack of uniformity during substrate processing. Factors that may affect uniformity are substrate edge effects. Another cause of defective devices may be due to polymeric by-products flaking off from the backside of one substrate onto another substrate during transport.

Current fabrication technologies are challenged by the demand for higher performance devices, the pressure to further reduce substrate feature sizes, as well as the implementation of newer optimized substrate materials. For example, it is becoming increasing difficult to maintain the uniformity or process results from the center to the edge of larger substrates (e.g., >300 mm). In general, for a given feature size, the number of devices on the substrate near the edge increases as the size of the substrate becomes larger. Likewise, for a given substrate size, the number of devices on the substrate near the edge increases as the feature size of the devices decreases. For example, often over 20% the total number of devices on a substrate are located near the perimeter of the substrate.

FIG. 1 shows a simplified diagram of a capacitively-coupled plasma processing system with a single hot edge ring. In general, an RF generator 112 is used to generate the plasma as well as control the plasma density via capacitively coupling. Certain etch applications may require the upper electrode to be grounded and the lower electrode to be powered by RF energy.

Generally, an appropriate set of gases is flowed through an inlet in an upper electrode 102. The gases are subsequently ionized to form plasma 104, in order to process (e.g., etch or deposit onto) exposed areas of substrate 106, such as a semiconductor substrate or a glass pane, positioned with a hot edge ring (HER) 116 (e.g., Si, etc.) on an electrostatic chuck (ESC) 108, which also serves as a powered electrode.

Hot edge ring 116 generally performs many functions, including positioning substrate 106 on ESC 108 and shielding the underlying components not protected by the substrate itself from being damaged by the ions of the plasma. Hot edge ring 116, as shown in FIG. 1, is disposed under and around the edge of substrate 106. Hot edge ring 116 may further sit on coupling ring 114 (e.g., quartz, etc.), which is generally configured to provide a current path from chuck 108 to hot edge ring 116.

As shown in FIG. 1, a quartz sleeve 126 is configured to protrude from coupling ring 114 to insulate HER 116 from ESC 108 to minimize direct RF coupling from ESC assembly 108 and 110 to HER 116. The RF coupling of HER 116 to ESC assembly 108 and 110 is provided by coupling ring 114. Quartz sleeve 126 and coupling ring 114 may be a single part or may be two separate parts.

In the example of FIG. 1, insulator rings 118 and 120 are configured to provide insulation between ESC 108 and ground ring 122. Quartz cover 124 is disposed on top of ground ring 122. Material for coupling ring 114 may be quartz or appropriate material to optimize RF coupling from ESC 108 to HER 116. For example, quartz may be employed as coupling ring 114 to minimize RF coupling to HER 116. In another example, aluminum may be employed as coupling ring 114 to get increase RF coupling to HER 116.

Due to substrate edge effects, such as electric field, plasma temperature, and the loading effects from process chemistry, the process results near the substrate edge may differ from the remaining (center) area of the substrate during plasma processing. For example, the electric field around substrate 106 edge may change due to changes from RF coupling to HER 116. The equipotential lines of the plasma sheath may become disrupted, causing non-uniform ion angular distribution around the substrate edge.

Generally, it is desirable for the electric field to remain substantially constant over the entire surface of the substrate in order to maintain process uniformity and vertical etch profiles. During plasma processing, RF coupling balance between substrate 106 and HER 116 may be optimized by design to maintain process uniformity and vertical etch. For example, RF coupling to HER 116 may be optimized for maximum RF coupling to get uniform etching. However, the RF coupling balance to maintain process uniformity may come at a cost to beveled edge polymer deposition.

During the etch process, it may be common for polymer byproducts (e.g., fluorinated polymers, etc.) to form on the substrate backside and/or around the substrate edge. Fluorinated polymers generally are comprised of photo resist material previously exposed to an etch chemistry, or polymer byproducts deposited during a fluorocarbon etch process. In general, a fluorinated polymer is a substance with a chemical equation of $C_xH_yF_z$, where x, z are integers greater than 0, and y is an integer greater or equal to 0 (e.g., $CF_4$, $C_2F_6$, $CH_2F_2$, $C_4F_8$, $C_5F_8$, etc.).

However, as successive polymer layers are deposited on the edge area as the result of several different etch processes, organic bonds that are normally strong and adhesive will eventually weaken and peel or flake off, often onto another substrate during transport. For example, substrates are commonly moved in sets between plasma processing systems via substantially clean containers, often called cassettes. As a higher positioned substrate is repositioned in the container, a portion of a polymer layer may fall on a lower substrate where dies are present, potentially affecting device yield.

FIG. 2 shows a simplified diagram of a substrate in which a set of edge polymers have been deposited on the planar backside is shown. As previously stated, during the etch process, it may be common for polymer by-products (edge polymers) to form on the substrate. In this example, the polymer by-products have been deposited on the planar backside, that is, the side of the substrate away from the plasma. For example, the polymer thickness may be about 250 nm at about 70° 202, 270 nm at about 45° 204, and about 120 nm at 0° 206. In general, the greater the thickness of the polymer, the higher the probability that a portion of the polymer may become dislodged and fell onto another substrate or the chuck, potentially affecting manufacturing yield.

For example, RF coupling to HER 116 may be optimized for minimal RF coupling to reduce polymer by-products deposition on beveled edge. However, the RF coupling balance to minimize beveled edge polymer deposition may come at a cost to maintain process uniformity at substrate edge.

Hence, aforementioned prior art methods may require the optimized hot edge ring to have a fixed geometry and/or material resulting in a constant value for RF coupling. Thus, the balancing of RF coupling between the hot edge ring and the substrate may be required to trade-off between optimizing for edge uniformity or beveled edge polymer deposition.

SUMMARY OF INVENTION

The invention relates, in an embodiment, to a method for processing a substrate in a plasma processing chamber. The substrate is disposed above a chuck and surrounded by an edge ring. The edge ring is electrically isolated from the chuck. The method includes providing RF power to the chuck. The method also includes providing a tunable capacitance arrangement. The tunable capacitance arrangement is coupled to the edge ring to provide RF coupling to the edge ring, resulting in the edge ring having an edge ring potential. The method further includes generating a plasma within the plasma processing chamber to process the substrate. The substrate is processed while the tunable capacitance arrangement is configured to cause the edge ring potential to be dynamically tunable to a DC potential of the substrate while processing the substrate.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
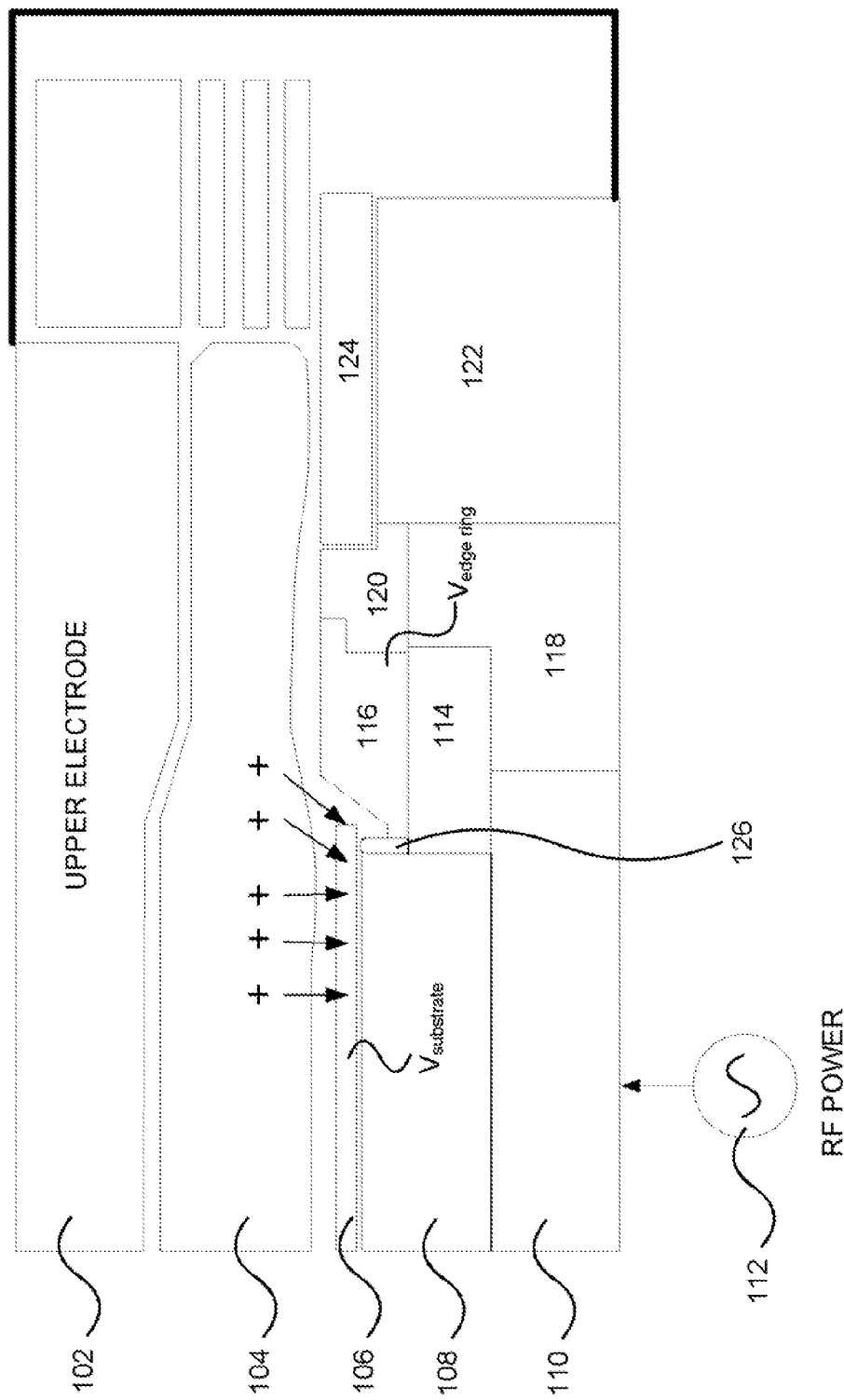
FIG. 1 shows a simplified diagram of a capacitively-coupled plasma processing system with a single hot edge ring.
Figure 2:
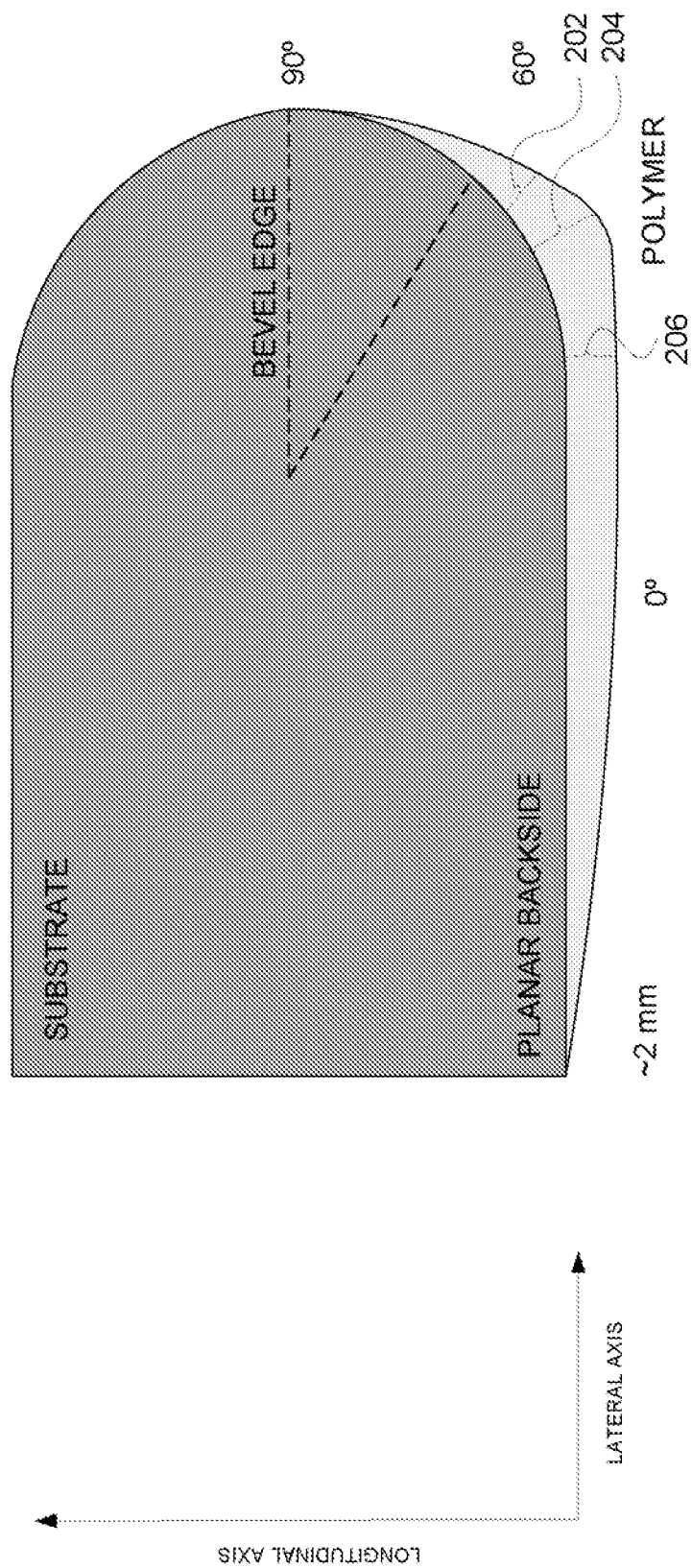
FIG. 2 shows a simplified diagram of a substrate in which a set of edge polymers have been deposited on the planar backside is shown.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the invention, there are provided methods and arrangements for configuring a plasma processing system to enhance control over plasma processing parameters. Embodiments of the invention include providing a tunable capacitance arrangement for RF coupling to a hot edge ring to produce desired electric potential differences between a substrate and the hot edge ring. Thus, the equipotential lines of the plasma sheath for a given plasma process may be optimized to achieve uniform etching at a substrate edge without sacrificing cleaning of polymer by-products from the beveled edge of the substrate.

In one or more embodiments of the invention, a coupling ring assembly may be configured with an upper coupling ring and a lower coupling ring. In an embodiment, the upper coupling ring and the lower coupling ring may be coupled to form a hermetic seal. Disposed inside of the hermetically sealed coupling ring assembly is a cavity, the hermetically sealed cavity may be configured with an inlet and an outlet to transport a dielectric material into and out of the cavity in an embodiment. In an embodiment, the capacitance of the coupling ring assembly may be modified by changing the dielectric material inside the hermetically sealed cavity to affect the electrical properties at an area on top of a hot edge ring. Thus, during plasma processing, the capacitance of the coupling ring may be adjusted to minimized electrical potential difference between a substrate and the hot edge ring to attain uniform etching of the substrate. Similarly, the capacitance of the coupling ring may be adjusted to maximized electrical potential difference between the substrate and the hot edge ring to perform beveled edge cleaning of the substrate.

In an embodiment, an HER may be configured with a contact foot. A moveable connector may be disposed above a shaft to move the connector up or down to make contact with the contact foot in an embodiment. The shaft may be RF coupled to an ESC lower electrode through a strap in accordance with an embodiment of the invention. In an embodiment, during plasma processing, the connector may be moved up or down to make contact with the contact foot to act as a mechanical switch, i.e. a DC relay switch, turning on or off the RF coupling from the ESC lower electrode to the HER. Thus, when contact is made between the connector and the foot, the RF coupling to the HER may be optimized for uniform etching. Whereas, when there is no contact between the connector and the foot, the RF coupling to the HER may be minimized for beveled edge cleaning.

In an embodiment, a lower hot edge ring may be configured with a first plate which may protrude downward. Lower hot edge ring may be disposed below a HER and may not be exposed to plasma in an embodiment. In another embodiment, first plate may be coupled directly to HER without employing a lower hot edge ring. In accordance with an embodiment of the invention, the first plate may be configured to be parallel with a second plate to form a mechanical capacitor arrangement with an air gap between the first plate and the second plate. In an embodiment, the second plate may be RF coupled to lower ESC electrode by a plurality of straps. During plasma processing, the capacitance of the mechanical capacitor arrangement may be dynamically adjusted by moving the second plate relative to the first plate to change the overlapping area between the two plates in an embodiment. Thus, the RF coupling from the ESC lower electrode to the HER may be adjusted dynamically by the mechanical capacitor arrangement.

In another embodiment, the mechanical capacitor arrangement may be configured from a plurality of concentric rings. In an embodiment, a concentric ring may be configured with a plurality of cutouts and a plurality of sections separating the cutouts. Depending on a predetermined need for optimum RF coupling, each cutout and/or each section may be configured with a similar or different geometry in an embodiment. In an embodiment, two concentric rings each with a plurality of cutouts may be disposed below a hot edge ring. The concentric rings may be separated by an air gap to form a capacitor arrangement in an embodiment. During plasma processing, the capacitance of the concentric rings capacitor arrangement may be dynamically adjusted to vary the RF coupling from an ESC assembly to an HER.

Figure 3:
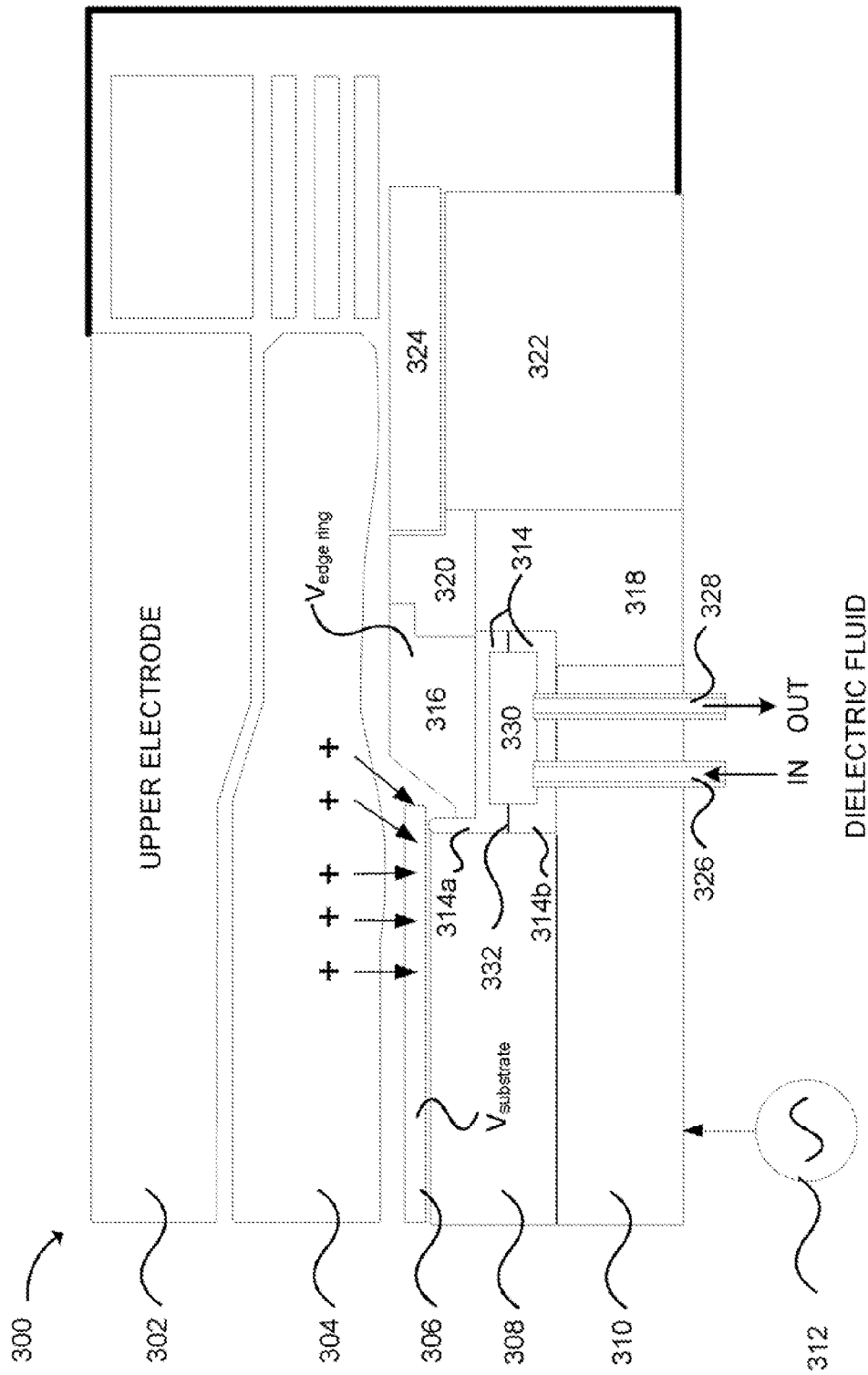
FIG. 3 shows, in accordance with an embodiment of the present invention, a simplified schematic of a capacitively-coupled plasma processing system configured with a coupling ring assembly with a hermetically sealed cavity to provide tunable capacitance.

The features and advantages of the invention may be better understood with reference to the figures and discussions that follow. FIG. 3 shows, in accordance with an embodiment of the present invention, a simplified schematic of a capacitively-coupled plasma processing system 300 configured with a coupling ring assembly with a hermetically sealed cavity to provide tunable capacitance.

Plasma processing system 300 may be a single, double, or triple frequency RF capacitively discharge system. In an example, radio frequencies may include, but are not limited to, e.g., 2 MHz, 27 MHz, and 60 MHz. Plasma processing system 300 may be configured to include a substrate 306 being disposed above an electrostatic chuck (ESC) 308. ESC 308, which also serves as a powered electrode, is disposed above an ESC lower electrode 310.

Consider the situation wherein, for example, substrate 306 is being processed. During plasma processing, a multifrequency RF generator 312 with a path to ground (not shown to simplify the figure) may supply low RF bias power to ESC lower electrode 310 through an RF match network (not shown to simplify the figure). The RF power from RF generator 312 may interact with a gas (not shown to simplify the figure) to ignite plasma 304 between an upper electrode 302 and substrate 306. Plasma may be employed to etch and/or deposit materials onto substrate 306 to create electronic devices.

As shown in FIG. 3, certain etch applications may require upper electrode 302 to be grounded with respect to a lower electrode, which is RF powered. The RF power is at least one of 2 MHz, 27 MHz, and 60 MHz. Still other etch applications may require both the upper electrode and the lower electrode to be RF powered using similar RF frequencies.

In the implementation of FIG. 3, insulator rings 318 and 320 are configured to provide insulation between a hot edge ring (HER) 316 and a ground ring 322. A quartz cover 324 is disposed on top of ground ring 322. HER 316 may further sit on a coupling ring assembly 314. Coupling ring assembly 314 may be made from conductive materials such as aluminum or graphite to provide RF coupling from ESC assembly, e.g., ESC 308 and ESC lower electrode 310, to HER 316.

In contrast to the prior art, where the coupling ring is a monolithic structure, coupling ring assembly 314 is configured with an upper coupling ring 314a, a lower coupling ring 314b, and a cavity 330 in accordance with an embodiment of the invention. In an embodiment, cavity 330 is hermetically sealed inside the coupling ring assembly. As the term is employed herein, a hermetic seal is designed to prevent gas or liquid from entering or escaping from a cavity.

In an embodiment, cavity 330 may be hermetically sealed by employing an o-ring (not shown) to be disposed at an interface 332 between upper coupling ring 314a and lower coupling ring 314b. Alternatively, other means of forming a hermetic seal may be employed, e.g., resistance welded, solder seal, and/or glass seal, to appropriately match the material being employed as the coupling ring assembly.

While not wishing to be bound by theory, the inventors herein believed that changing the capacitance of coupling ring assembly 314 may result in a corresponding change in RF voltage at the top surface of HER 316. For example, as the capacitance is being increased through the coupling ring assembly, the impedance of the coupling ring assembly is being decreased resulting in a higher RF voltage at the top surface of the HER. Therefore, a higher plasma density may be generated in the area above the HER.

On the other hand, for example, if the capacitance of the coupling ring assembly is decreased, the impedance may decrease resulting in a lower RF voltage on the top surface of the HER. Thus, the plasma density in the area above the HER may be less.

In accordance with an embodiment of the invention. FIG. 3 shows coupling ring assembly 314 with hermetically sealed cavity 330, an inlet channel 326 and an outlet channel 328. In an embodiment, inlet channel 326 and outlet channel 328 are configured to transport dielectric materials info and out of hermetically sealed cavity 330. Thus, the capacitance of coupling ring assembly 314 may be modified by changing the dielectric material inside cavity 330 in an embodiment.

Dielectric materials may be a solid, liquid, or gas. For example, dielectric materials such air, nitrogen, mineral oil, castor oil, water, glycerol, and the like, may be employed to achieve a predetermined capacitance in an embodiment.

In an embodiment, the control to transport dielectric materials into and/or out of cavity 330 may be an active or passive flow control system. In an active flow control system, the dielectric material flowing into and/or out of cavity 330 may be dynamically controlled. For example, the dielectric material may be flowed through the cavity at a predetermined flow rate during plasma processing. In another example, for the passive flow control system, the dielectric material may be flowed into cavity 330 at a desired volume. However, during plasma processing, the dielectric material is not being dynamically flowed through cavity 330 for a passive flow control system.

Consider the situation wherein, for example, uniform etching of substrate 306 may be desired during plasma processing. In an example, a first dielectric material may be selected to give coupling ring assembly 314 a predetermined capacitance to optimize RF coupling from ESC assembly to HER 316 to achieve similar plasma sheath between an area of RF sheath voltage ($V_{edge\ ring}$) above substrate edge ring 316 with respect to an area of RF sheath voltage ($V_{substrate}$) above substrate 306 to produce minimal electrical potential differences ($V_{substrate}-V_{ring}$) in accordance with an embodiment. Thus, the equipotential lines of the plasma sheath for a given plasma process is optimized to keep ion bombardments to the edge of substrate 306 straight. The vertical ion bombardments at the edge of substrate 306 may ensured uniform etching with respect to the center of the substrate during plasma processing and the vertical profile of the etched pattern.

Alternatively, a second dielectric material may be selected to give coupling ring assembly 314 a predetermined capacitance to minimize RF coupling from ESC assembly to HER 316 to achieve dissimilar plasma sheath between an area of RF sheath voltage ($V_{edge\ ring}$) above substrate edge ring 316 with respect to an area of RF sheath voltage ($V_{substrate}$) above substrate 306 to produce maximum electrical potential differences ($V_{substrate}-V_{edge\ ring}$) in accordance with an embodiment.

Due to the high voltage potential between substrate 306 and HER 316, arcing may occur on the beveled edge of substrate 306. Normally, arcing is an uncontrolled event that is undesirable. However, there are no devices on the beveled edge of a substrate. Thus, arcing or micro-explosion on the beveled edge of substrate 306 may be desirable as a cleaning mechanism to remove polymer by-products deposited on beveled edge of the substrate in accordance with an embodiment of the invention.

In the prior art, the coupling ring is a monolithic structure and the RF coupling to the HER is optimized to balance between uniform etching at a substrate edge or deposition of polymer by-products on the beveled edge. Unlike prior art methods, the capacitance of the coupling ring assembly is tunable by having a predetermined dielectric material inside the cavity of the coupling ring assembly. Thus, in multi-steps plasma processing of a substrate, the electrical property on the hot edge ring may be adjusted to achieve uniform etching during the etching step and beveled edge cleaning of polymer by-products deposition during the cleaning step.

Figure 4:
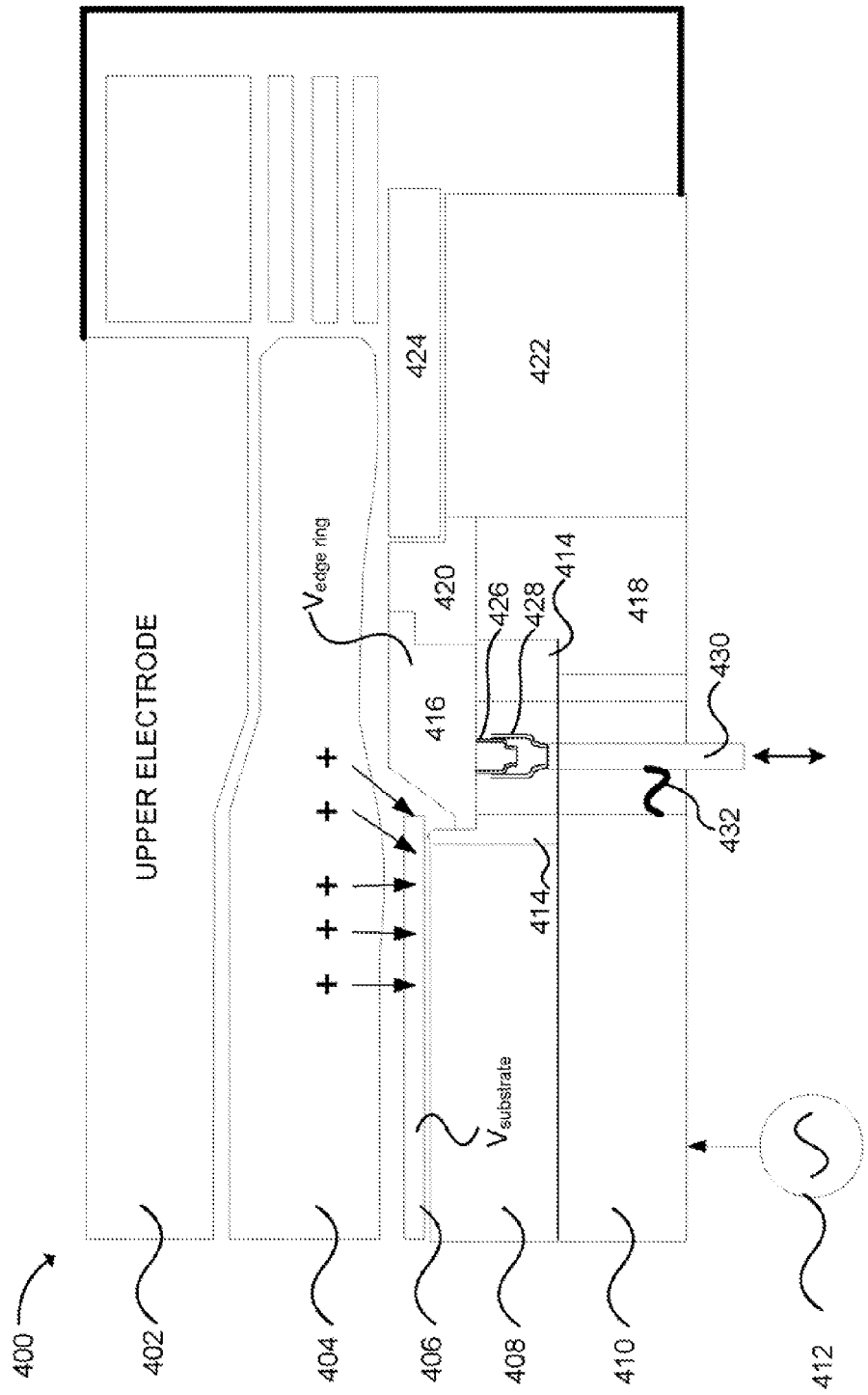
FIG. 4 shows, in accordance with an embodiment of the invention, a multi-frequency capacitively coupled plasma processing system being configured with a DC relay switch.

FIG. 4 shows, in accordance with an embodiment of the invention, a multi-frequency capacitively coupled plasma processing system 400 being configured with a DC relay switch. Plasma processing system 400 may be configured to include a grounded upper electrode 402, a substrate 406, an electrostatic chuck (ESC) 408, an ESC lower electrode 410, insulator rings 418 and 420, a ground ring 422, and a quartz cover 424.

Consider the situation wherein, for example, substrate 406 is being processed. Plasma 404 may be struck when gas (not shown to simply the figure) interacts with RF power from an RF power generator 412. Plasma 404 may be employed to etch and/or deposit materials onto substrate 406 to create electronic devices.

As aforementioned, substrate edge effects, such as electric field, plasma temperature, and the loading effects from process chemistry, may cause the process results near the substrate edge to be differed from the remaining (center) area of the substrate. For example, the equipotential lines of the plasma sheath may become disrupted, causing non-uniform ion angular distribution around the substrate edge.

In the implementation of FIG. 4, an HER 416 is disposed above a coupling ring 414 and around the edge of substrate 406. In an embodiment, HER 416 may be configured with contact foot 426. A moveable connector 428 may be disposed above a shaft 430 to move connector 428 up and/or down in accordance with an embodiment of the invention. In an embodiment, shaft 430 is configured to achieve RF coupling with ESC lower electrode 410 through a strap 432. By moving connector 428 up and/or down, connector 428 may make physical contact with contact foot 426 to act as a mechanical switch, i.e., DC relay switch, to turn on or off the RF coupling from ESC lower electrode 410 to HER 416 in an embodiment.

In an embodiment, RF coupling to HER 416 may be optimized to provide minimal potential difference ($V_{substrate}-V_{edge\ ring}$) between substrate 406 and HER 416 to achieve uniform etching at the edge of the substrate when connector 428 is moved up to make physical contact with contact foot 426.

In another embodiment, RF coupling to HER 416 may be minimized to provide maximum potential difference ($V_{substrate}-V_{edge\ ring}$) between substrate 406 and HER 416 to remove polymer by-products deposited on beveled edge of the substrate when connector 428 is moved down such that no contact is being made with contact foot 426.

In the prior art, the RF coupling to the HER is optimized to balance between uniform etching at a substrate edge or deposition of polymer by-products on the beveled edge. Unlike prior art methods, the mechanical switch may be configured to change the RF coupling to HER from ESC lower electrode on or off to affect the electrical properties on top of the HER. Thus, in multi-steps plasma processing of a substrate, the electrical property on the hot edge ring may be optimized through RF coupling by turning on the mechanical switch to achieve uniform etching during the etching step. Similarly, beveled edge cleaning of polymer by-products deposition may be achieved by turning off RF coupling with the mechanical switch during the cleaning step.

Figure 5A:
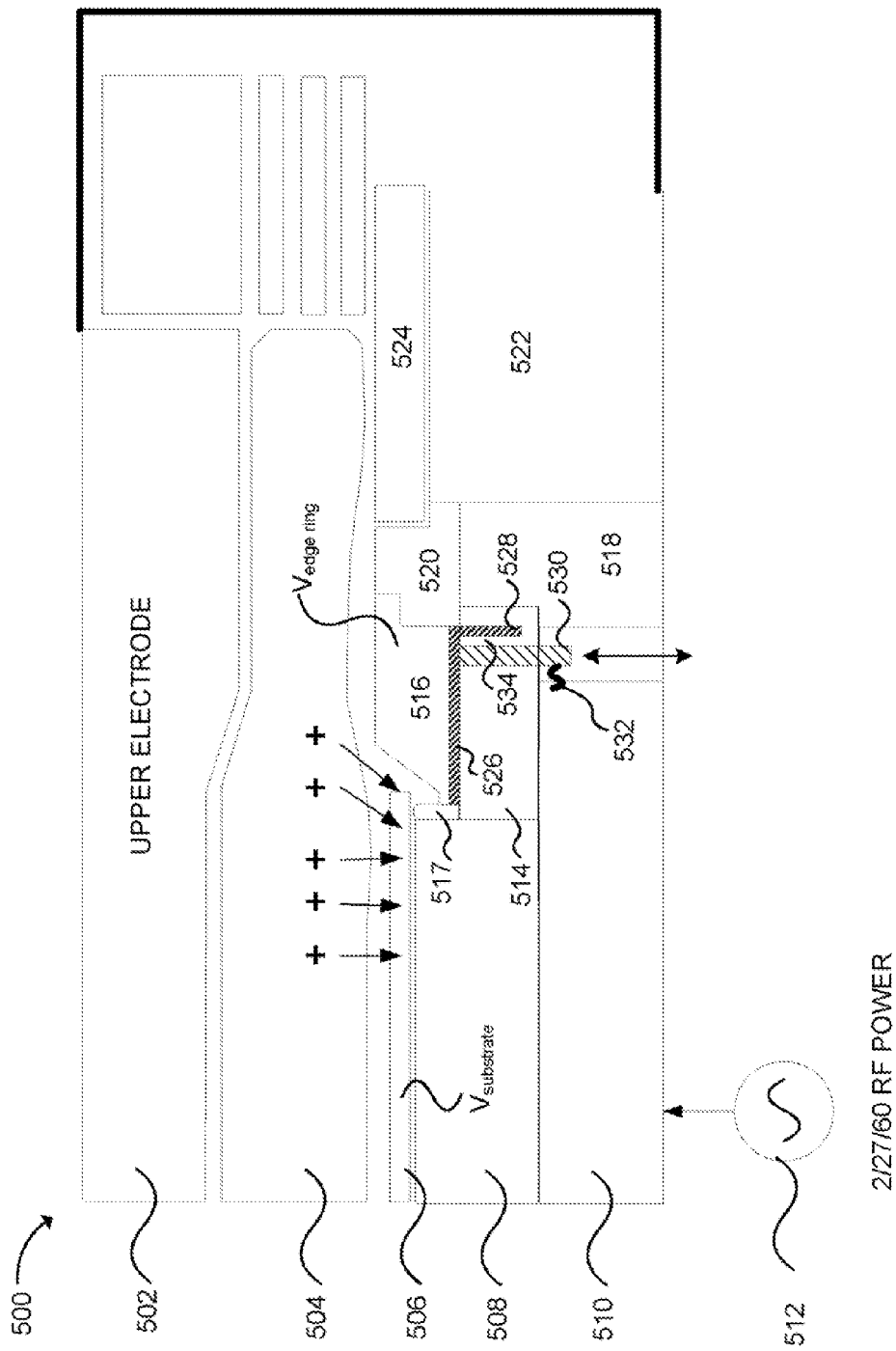
FIG. 5A shows, in accordance with an embodiment of the invention, a multi-frequency capacitively coupled plasma processing system being configured with a mechanical capacitor arrangement.

FIG. 5A shows, in accordance with an embodiment of the invention, a multi-frequency capacitively coupled plasma processing system 500 being configured with a mechanical capacitor arrangement. Plasma processing system 500 may be configured to include a grounded upper electrode 502, a substrate 506, an electrostatic chuck (ESC) 508, an ESC lower electrode 510, a quartz sleeve 517, insulator rings 518 and 520, a ground ring 522, and a quartz cover 524.

Consider the situation wherein, for example, substrate 506 is being processed. Plasma 504 may be struck when gas (not shown to simply the figures) interacts with RF power from an RF power generator 512. Plasma 504 may be employed to etch and/or deposit materials onto substrate 506 to create electronic devices.

In the implementation of FIG. 5, an HER 516 is disposed around the edge of substrate 508. Quartz sleeve 517 is configured to insulate HER 516 from ESC 508 to minimize direct RF coupling from ESC assembly 508 and 510 to HER 516.

In an embodiment, a lower HER ring 526, which may be configured with a first capacitor ring 528 protruding downward, may be disposed below HER 516. Lower HER ring 526 is not exposed to plasma 504 and may not need to be replaced a frequently as HER 516 in an embodiment. In accordance with an embodiment of the invention, first ring 528 protruding downward from lower HER ring 526 may be configured to be parallel with a second ring 530 to form a mechanical capacitor arrangement with an air gap 534 in the opened cavity area 514. Second ring 530 may be RF coupled to ESC lower electrode 510 through a plurality of straps 532 in an embodiment. In an embodiment, the plurality of straps 532 may be employed to provide azimuthal uniformity of RF coupling around second ring 530.

Alternatively, in another embodiment, first ring 528 may be attached directly to HER 516 to form the capacitor arrangement with second ring 530. Lower HER ring 526 may not be necessary in this implementation.

During plasma processing, second ring 530 may be configured to move up and/or down relative to first ring 528 to change the overlapping area between second ring 530 and first ring 528 in an embodiment. By changing the overlapping area, the capacitance may be dynamically adjusted during plasma processing to vary the RF coupling from ESC lower electrode 510 to HER 516 in an embodiment.

In an embodiment, RF coupling to HER 516 may be optimized to provide minimal potential difference ($V_{substrate}-$ $V_{edge\ ring}$) between substrate 506 and HER 516 to achieve uniform etching at the edge of the substrate when second ring 530 is moved up to create maximum overlapping with first ring 528.

In another embodiment, RF coupling to HER 516 may be minimized to provide maximum potential difference ($V_{substrate}-V_{edge\ ring}$) between substrate 506 and HER 516 to remove polymer by-products deposited on beveled edge of the substrate when second ring 530 is moved down such that no overlapping is being made with first ring 528.

Figure 5B:
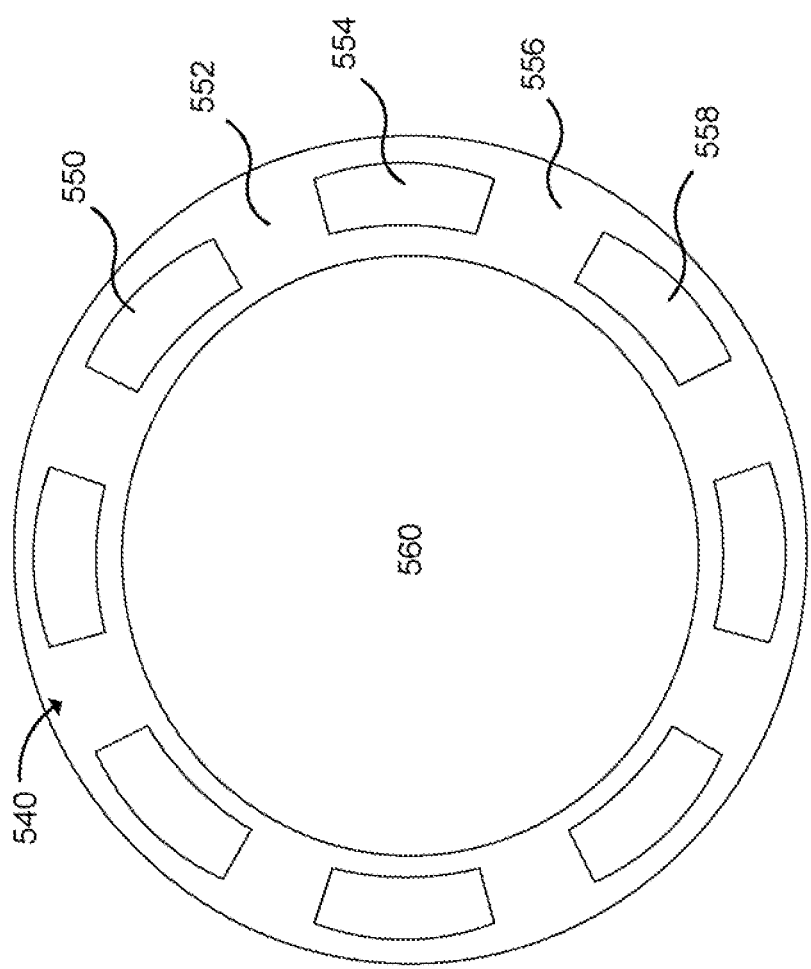
FIG. 5B shows, in accordance with an embodiment of the invention, a top view of a concentric ring being configured with cutouts that may be employed in a variable capacitor arrangement.

FIG. 5B shows, in accordance with an embodiment of the invention, a top view of a concentric ring 540 being configured with cutouts that may be employed in a variable capacitor arrangement. In an embodiment, concentric ring 540 may be configured with cutouts 550, 554 and 558. A first cutout 550 may be separated by a first section 552, a second cutout 554 may be separated by a second section 556, and the like around concentric ring 540 in an embodiment.

In accordance with an embodiment of the invention, first cutout 550 may have the same area as second cutout 552. Alternatively, first cut out 550 may have a different area from second cutout 554. In an embodiment, first section 552 may have the same area as second section 556. Alternatively, first section 552 may have a different area from second section 556 in an embodiment. Thus, each cutout and/or each section around the concentric ring may have similar or different area depending on a predetermined need for optimum RF coupling.

Consider the situation wherein, for example, two concentric rings, similar to concentric ring 540, may be disposed under a HER. The concentric rings may be separated by an air gap to form a capacitor arrangement in an embodiment. The capacitance may be varied by rotating a first concentric ring past a second concentric ring such that the overlapping area of cutouts and solid sections may be varied to dynamically adjust the capacitance. Thus, a mechanical capacitor arrangement configured with two concentric rings having cutouts may be employed to provide variable capacitance to affect RF coupling from ESC assembly to HER.

As may be appreciated from the foregoing, embodiments of the invention provide methods and arrangements to vary RF coupling of the hot edge ring through the mechanism of changing the capacitance between ESC assembly and the hot edge ring. By varying the RF coupling to the HER, etching uniformity at the substrate edge may be achieve without trading-off cleaning of polymer by-products at the beveled edge during plasma processing.

While this invention has been described in terms of several preferred embodiments, there are alterations, permutations, and equivalents, which fall within the scope of this invention. Also, the title, summary, and abstract, are provided herein for convenience and should not be used to construe the scope of the claims herein. It should also be noted that there are many alternative ways of implementing the methods and apparatuses of the present invention. Although various examples are provided herein, it is intended that these examples be illustrative and not limiting with respect to the invention. Further, in this application, a set of "n" items refers zero or more items in the set. It is therefore intended that the following appended claims be interpreted as including all such alterations, permutations, and equivalents as fall within the true spirit and scope of the present invention.

What is claimed is:

1. A method for processing a substrate in a plasma processing chamber, said substrate being disposed above an electrostatic chuck and surrounded by an edge ring, said edge ring being electrically isolated from said chuck, the method comprising:
    providing RF power to said electrostatic chuck;
    using a coupling ring assembly to provide RF coupling from said electrostatic chuck to said edge ring said coupling ring assembly surrounding said electrostatic chuck, wherein said coupling ring assembly includes an upper coupling ring and a lower coupling ring coupled with said upper coupling ring, a cavity being formed between said upper coupling ring and said lower coupling ring;
    transporting a dielectric material into or out of said cavity to change capacitance of said coupling ring; and
    generating a plasma within said plasma processing chamber to process said substrate.

2. The method of claim 1, said transporting said dielectric material is performed when said substrate is processed inside said plasma processing chamber.

3. The method of claim 1, wherein said dielectric material includes at least a solid material.

4. The method of claim 1, wherein said dielectric material includes at least one of air, nitrogen, mineral oil, castor oil, water, and glycerol.

5. The method of claim 1 further comprising transporting additional dielectric material into said cavity to change said dielectric material inside said cavity.

6. The method of claim 1 further comprising transporting a portion of said dielectric material out of said cavity to change said dielectric material inside said cavity.

7. The method of claim 1 further comprising:
    flowing a first dielectric material into said cavity to give said coupling ring assembly a first predetermined capacitance for optimizing said RF coupling from said electrostatic chuck to said edge ring; and
    flowing a second dielectric material into said cavity to give said coupling ring assembly a second predetermined capacitance for minimizing said RF coupling from said electrostatic chuck to said edge ring.

8. The method of claim 1 further comprising disposing an o-ring inside said coupling ring assembly to seal said cavity.

9. The method of claim 1 wherein said transporting said dielectric material inside said cavity increases said capacitance of said coupling ring assembly to increase RF voltage at a top surface of said edge ring.

10. The method of claim 1 wherein said transporting said dielectric material inside said cavity decreases said capacitance of said coupling ring assembly to decrease RF voltage at a top surface of said edge ring.

11. The method of claim 1 further comprising:
    transporting said dielectric material into or out of said cavity to cause said edge ring to have a first electrical property;
    etching said substrate when said edge ring has said first electrical property;
    transporting said dielectric material into or out of said cavity to cause said edge ring to have a second electrical property; and
    cleaning an edge of said substrate when said edge ring has said second electrical property.

12. The method of claim 1 further comprising:
    sealing an interface between said upper coupling ring and said lower coupling ring.

13. The method of claim 12 wherein said sealing includes resistance welding said interface between said upper coupling ring and said lower coupling ring.

14. The method of claim 12 wherein said sealing includes using solder seal at said interface between said upper coupling ring and said lower coupling ring.

15. The method of claim 12 wherein said sealing includes using glass seal at said interface between said upper coupling ring and said lower coupling ring.

16. The method of claim 12 wherein said sealing includes disposing an o-ring at said interface between said upper coupling ring and said lower coupling ring.

17. The method of claim 12 further comprising matching a seal means used at said interface with a material of said coupling ring assembly.

18. The method of claim 1 wherein said coupling ring assembly is made of graphite.

19. The method of claim 1 further comprising:
flowing said dielectric material into said cavity at a volume; and
preventing said dielectric material from flowing through said cavity when said substrate is processed inside said plasma processing chamber.

20. The method of claim 1 wherein said dielectric material is transported into said cavity via an inlet channel and said dielectric material is transported out of said cavity via an outlet channel.

* * * * *